United States Patent
Kobrin

(10) Patent No.: US 9,465,296 B2
(45) Date of Patent: *Oct. 11, 2016

(54) NANOPATTERNING METHOD AND APPARATUS

(75) Inventor: Boris Kobrin, Dublin, CA (US)

(73) Assignee: Rolith, Inc., Pleasanton, CA (US)

( * ) Notice: Subject to any disclaimer, the term of this patent is extended or adjusted under 35 U.S.C. 154(b) by 369 days.

This patent is subject to a terminal disclaimer.

(21) Appl. No.: 13/546,436

(22) Filed: Jul. 11, 2012

(65) Prior Publication Data

US 2012/0274004 A1 Nov. 1, 2012

Related U.S. Application Data

(63) Continuation-in-part of application No. PCT/US2011/000029, filed on Jan. 7, 2011.

(60) Provisional application No. 61/335,877, filed on Jan. 12, 2010.

(51) Int. Cl.
   G03F 7/24 (2006.01)
   G03F 7/20 (2006.01)
   G03F 1/34 (2012.01)
   (Continued)

(52) U.S. Cl.
   CPC .............. *G03F 7/2035* (2013.01); *B82Y 40/00* (2013.01); *G03F 1/0007* (2013.01); *G03F 1/0084* (2013.01); *G03F 1/50* (2013.01); *G03F 1/60* (2013.01); *G03F 7/0012* (2013.01); *G03F 7/2032* (2013.01); *G03F 7/2014* (2013.01)

(58) Field of Classification Search
   CPC .. G03F 7/2035; G03F 7/2032; G03F 7/0012; G03F 1/0084; G03F 1/0007; G03F 1/50; G03F 1/60; G03F 7/2014; B82Y 40/00
   See application file for complete search history.

(56) References Cited

U.S. PATENT DOCUMENTS 5,928,815 A   7/1999  Martin
6,045,980 A * 4/2000  Edelkind et al. ............. 430/320
(Continued)

FOREIGN PATENT DOCUMENTS

JP     59200419         11/1984
JP     2005-085965   *  3/2005
(Continued)

OTHER PUBLICATIONS

Han et al., "Fabrication of complex nanostructures on various substrates", Appl. Phys. Lett., vol. 91 pp. 123118-1 to 123118-3 (Sep. 2007).*
(Continued)

*Primary Examiner* — Martin Angebranndt
(74) *Attorney, Agent, or Firm* — Joshua D. Isenberg; JDI Patent

(57) ABSTRACT

Embodiments of the invention relate to methods and apparatus useful in the nanopatterning of large area substrates, where a movable nanostructured film is used to image a radiation-sensitive material. The nanopatterning technique makes use of Near-Field photolithography, where the nanostructured film used to modulate light intensity reaching radiation-sensitive layer. The Near-Field photolithography may make use of an elastomeric phase-shifting mask, or may employ surface plasmon technology, where a movable film comprises metal nano holes or nanoparticles.

26 Claims, 6 Drawing Sheets

(51) Int. Cl.
  *G03F 1/00* (2012.01)
  *G03F 7/00* (2006.01)
  *G03F 1/50* (2012.01)
  *G03F 1/60* (2012.01)
  *B82Y 40/00* (2011.01)

(56) References Cited

U.S. PATENT DOCUMENTS

| | | | |
|---|---|---|---|
| 6,060,143 A * | 5/2000 | Tompkin et al. | 428/64.1 |
| 6,274,294 B1 * | 8/2001 | Hines | 430/322 |
| 6,753,131 B1 | 6/2004 | Rogers et al. | |
| 6,809,356 B2 | 10/2004 | Chou | |
| 8,182,982 B2 * | 5/2012 | Kobrin | 430/322 |
| 8,192,920 B2 * | 6/2012 | Kobrin | 430/322 |
| 8,318,386 B2 * | 11/2012 | Kobrin | 430/2 |
| 8,334,217 B2 * | 12/2012 | Kobrin | 438/758 |
| 8,367,306 B1 * | 2/2013 | Doty et al. | 430/320 |
| 8,518,633 B2 * | 8/2013 | Kobrin et al. | 430/321 |
| 2002/0094483 A1 * | 7/2002 | Hattori et al. | 430/5 |
| 2003/0129385 A1 * | 7/2003 | Hojo et al. | 428/323 |
| 2004/0219246 A1 * | 11/2004 | Jeans | 425/174.4 |
| 2006/0033896 A1 * | 2/2006 | Kiriya | 355/53 |
| 2009/0087506 A1 | 4/2009 | Hasegawa et al. | |
| 2009/0174118 A1 | 7/2009 | Maeda et al. | |
| 2009/0269705 A1 | 10/2009 | Kobrin | |
| 2009/0297989 A1 | 12/2009 | Kobrin | |
| 2011/0210480 A1 * | 9/2011 | Kobrin | 264/447 |
| 2012/0162629 A1 * | 6/2012 | Kobrin | 355/89 |
| 2012/0224159 A1 * | 9/2012 | Kobrin | 355/53 |
| 2012/0282554 A1 * | 11/2012 | Kobrin et al. | 430/326 |
| 2013/0224636 A1 * | 8/2013 | Kobrin | 430/5 |

FOREIGN PATENT DOCUMENTS

| | | | |
|---|---|---|---|
| JP | 2009078521 A | | 4/2009 |
| WO | 2004108846 A2 | | 12/2004 |
| WO | 2006/043244 | * | 4/2006 |
| WO | 2006086841 | | 2/2008 |
| WO | 2009/094009 | * | 7/2009 |
| WO | 2009094009 A | | 7/2009 |
| WO | 2011087896 A3 | | 1/2012 |

OTHER PUBLICATIONS

Maria et al. "Nanopatterning with conformable phase masks", J. Photochem. Photobiol. A, Chem., vol. 166 pp. 149-154 (2004).*
Schmid et al. "Light-coupling masks for lensless, sub-wavelength optical lithography", Appl. Phys. Lett., vol. 72(19) pp. 2379-2381 (May 1998).*
Australian Patent Examination Report for AU App. No. 2011205582, dated Jan. 9, 2014.
U.S. Appl. No. 61/335,877, to Boris Kobrin, filed Jan. 12, 2010.
International Search Report and Written Opinion of the International Searching Authority for International application No. PCT/US2011/000029 dated Oct. 26, 2011.
Japanese Office Action for Japanese Patent Application No. 2012-548955 dated Sep. 27, 2013.
Korean Office Action for Korean Patent Application No. 10-2012-7021047 dated Nov. 14, 2013.
Russian Office Action for Russian Patent Application No. 2012134344/28 dated Dec. 12, 2012.
Canadian Office Action for Canadian Patent Application No. 2,786,489 dated Jul. 16, 2013.
Chinese Office Action for CN Application No. 2011800058810, dated Jun. 24, 2014.
Joana Maria, Experimental and computational studies of phase shift lithography with binary elastimeric masks, Journal of Vacuum Science and technology, B24(2), Mar./Apr. 2006.
R. Kunz, large area patterning of 50nm structures onflexible substrates using near-field 193 nm radiation, Journal of Vacuum Science and technology, B21(1), Jan./Feb. 2003.
Werayut Srituravanich, Plasmonic Nanolithography, Nanoletters, VA, N6, p. 1085, 2004.
Yasuhisa Inao, Near-field lithography as prototype nano-fabrication tool, MNE-06 Micro- and Nano-Engineering, 2C-6, Photon Lithography.
Russian Office Action for Ru Application No. 2012134344, dated Nov. 26, 2014.
Chinese Office Action for CN Application No. 201180005881.0, dated Mar. 9, 2015.
Yasuhisa Inao, Near-field lithography as prototype nano-fabrication tool, MNE-06 Micro- and Nano-Engineering, 2C-6, Photon Lithography, (2007).

* cited by examiner

NANOPATTERNING METHOD AND APPARATUS

CLAIM OF PRIORITY

The present application is a continuation-in-part of commonly-assigned, co-pending PCT application Ser. No. PCT/US2011/000029, filed Jan. 7, 2011, PCT application Ser. No. PCT/US2011/000029 claims the priority benefit of commonly assigned U.S. provisional Application No. 61/335,877, filed Jan. 12, 2010. The entire disclosures of PCT application Ser. No. PCT/US2011/000029 and U.S. provisional Application No. 61/355,877, filed Jan. 12, 2010 are incorporated herein by reference.

FIELD OF THE INVENTION

Embodiments of the invention relate to nanopatterning methods which can be used to pattern large substrates or substrates such as films which may be sold as rolled goods. Other embodiments of the invention pertain to apparatus which may be used to pattern substrates, and which may be used to carry out method embodiments, including the kind described.

BACKGROUND OF THE INVENTION

This section describes background subject matter related to the disclosed embodiments of the present invention. There is no intention, either express or implied, that the background art discussed in this section legally constitutes prior art.

Nanostructuring is necessary for many present applications and industries and for new technologies which are under development. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-filed phase shift lithography, and plasmonic lithography, for example.

Nanoimprint Lithography (NIL) creates patterns by mechanical deformation of an imprint resist, followed by subsequent processing. The imprint resist is typically a monomeric or polymeric formulation that is cured by heat or by UV light during the imprinting. There are a number of variations of NIL. However, two of the processes appear to be the most important. These are Thermoplastic Nanoimprint Lithography (TNIL) and Step and Flash Nanoimprint Lithography (SFIL).

TNIL is the earliest and most mature nanoimprint lithography. In a standard TNIL process, a thin layer of imprint resist (a thermoplastic polymer) is spin coated onto a sample substrate. Then a mold, which has predefined topological patterns, is brought into contact with the sample, and pressed against the sample under a given pressure. When heated above the glass transition temperature of the thermoplastic polymer, the pattern on the mold is pressed into a thermoplastic polymer film melt. After the sample, with impressed mold is cooled down, the mold is separated from the sample and the imprint resist is left on the sample substrate surface. The pattern does not pass through the imprint resist; there is a residual thickness of unchanged thermoplastic polymer film remaining on the sample substrate surface. A pattern transfer process, such as reactive ion etching, can be used to transfer the pattern in the resist to the underlying substrate. The variation in the residual thickness of unaltered thermoplastic polymer film presents a problem with respect to uniformity and optimization of the etch process used to transfer the pattern to the substrate.

Tapio Makela et al. of VTT, a technical research center in Finland, have published information about a custom built laboratory scale roll-to-roll imprinting tool dedicated to manufacturing of submicron structures with high throughput. Hitachi and others have developed a sheet or roll-to-roll prototype NIL machine, and have demonstrated capability to process 15 meter long sheets. The goal has been to create a continuous imprint process using belt molding (nickel plated molds) to imprint polystyrene sheets for large geometry applications such as membranes for fuel cells, batteries and possibly displays.

Hua Tan et al of Princeton University have published 2 implementations of roller Nanoimprint lithography: rolling cylinder mold on flat, solid substrate, and putting a flat mold directly on a substrate and rolling a smooth roller on top of the mold. Both methods are based on TNIL approach, where roller temperature is set above the glass transition temperature, Tg, of the resist (PMMA), while the platform is set to temperature below Tg. Currently the prototype tools do not offer a desirable throughput. In addition, there is a need to improve reliability and repeatability with respect to the imprinted surface.

In the SFIL process, a UV curable liquid resist is applied to the sample substrate and the mold is made of a transparent substrate, such as fused silica. After the mold and the sample substrate are pressed together, the resist is cured using UV light, and becomes solid. After separation of the mold from the cured resist material, a similar pattern to that used in TNIL may be used to transfer the pattern to the underlying sample substrate. Dae-Geun Choi from Korea Institute of Machinery suggested using fluorinated organic-inorganic hybrid mold as a stamp for Nanoimprint lithography, which does not require anti-stiction layer for demolding it from the substrate materials.

Since Nanoimprint lithography is based on mechanical deformation of resist, there are a number of challenges with both the SFIL and TNIL processes, in static, step-and-repeat, or roll-to-roll implementations. Those challenges include template lifetime, throughput rate, imprint layer tolerances, and critical dimension control during transfer of the pattern to the underlying substrate. The residual, non-imprinted layer which remains after the imprinting process requires an additional etch step prior to the main pattern transfer etch. Defects can be produced by incomplete filling of negative patterns and the shrinkage phenomenon which often occurs with respect to polymeric materials. Difference in thermal expansion coefficients between the mold and the substrate cause lateral strain, and the strain is concentrated at the corner of the pattern. The strain induces defects and causes fracture defects at the base part of the pattern mold releasing step.

Soft lithography is an alternative to Nanoimprint lithography method of micro and nano fabrication. This technology relates to replica molding of self assembling monolayers. In soft lithography, an elastomeric stamp with patterned relief structures on its surface is used to generate patterns and structures with feature sizes ranging from 30 nm to 100 nm. The most promising soft lithography technique is microcontact printing (µCP) with self-assembled monolayers (SAMS). The basic process of µCP includes: 1. A polydimethylsiloxane (PDMS) mold is dipped into a solution of a specific material, where the specific material is capable of forming a self-assembled monolayer (SAM). Such specific materials may be referred to as an ink. The specific material sticks to a protruding pattern on the PDMS master surface. 2. The PDMS mold, with the material-coated surface facing downward, is contacted with a surface of a metal-coated substrate such as gold or silver, so that only the pattern on the PDMS mold surface contacts the metal-coated substrate. 3. The specific material forms a chemical bond with the metal, so that only the specific material which is on the protruding pattern surface sill remains on the metal-coated surface after removal of the PDMS mold. The specific material forms a SAM on the metal-coated substrate which extends above the metal-coated surface approximately one to two nanometers (just like ink on a piece of paper). 4. The PDMS mold is removed from the metal-coated surface of the substrate, leaving the patterned SAM on the metal-coated surface.

Optical Lithography does not use mechanical deformation or phase change of resist materials, like Nanoimprint lithography, and does not have materials management problems like Soft Lithography, thus providing better feature replication accuracy and more manufacturable processing. Though regular optical lithography is limited in resolution by diffraction effects some new optical lithography techniques based on near field evanescent effects have already demonstrated advantages in printing sub-100 nm structures, though on small areas only. Near-field phase shift lithography NFPSL involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. In the case of a mask with a depth of relief that is designed to modulate the phase of the transmitted light by $\pi$, a local null in the intensity appears at the step edge of relief. When a positive photoresist is used, exposure through such a mask, followed by development, yields a line of photoresist with a width equal to the characteristic width of the null in intensity. For 365 nm (Near UV) light in combination with a conventional photoresist, the width of the null in intensity is approximately 100 nm. A PDMS mask can be used to form a conformal, atomic scale contact with a flat, solid layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Yasuhisa Inao, in a presentation entitled "Near-Field Lithography as a prototype nanofabrication tool", at the 32nd International Conference on Micro and Nano Engineering in 2006, described a step-and-repeat near-field nanolithography developed by Canon, Inc. Near-field lithography (NFL) is used, where the distance between a mask and the photoresist to which a pattern is to be transferred are as close as possible. The initial distance between the mask and a wafer substrate was set at about 50 µm. The patterning technique was described as a "tri-layer resist process", using a very thin photoresist. A pattern transfer mask was attached to the bottom of a pressure vessel and pressurized to accomplish a "perfect physical contact" between the mask and a wafer surface. The mask was "deformed to fit to the wafer". The initial 50 µm distance between the mask and the wafer is said to allows movement of the mask to another position for exposure and patterning of areas more than 5 mm×5 mm. The patterning system made use of i-line (365 nm) radiation from a mercury lamp as a light source. A successful patterning of a 4 inch silicon wafer with structures smaller than 50 nm was accomplished by such a step-and-repeat method.

In an article entitled "Large-area patterning of 50 nm structures on flexible substrates using near-field 193 nm radiation", JVST B 21 (2002), at pages 78-81, Kunz et al. applied near-field phase shift mask lithography to the nano-patterning of flexible sheets (Polyimide films) using rigid fused silica masks and deep UV wavelength exposure. In a subsequent article entitled "Experimental and computational studies of phase shift lithography with binary elastomeric masks", JVST B 24(2) (2006) at pages 828-835, Maria et al. present experimental and computational studies of a phase shifting photolithographic technique that uses binary elastomeric phase masks in conformal contact with layers of photoresist. The work incorporates optimized masks formed by casting and curing prepolymers to the elastomer poly (dimethylsiloxane) against anisotropically etched structures of single crystal silicon on Si02/Si. The authors report on the capability of using the PDMS phase mask to form resist features in the overall geometry of the relief on the mask.

U.S. Pat. No. 6,753,131 to Rogers et al, issued Jun. 22, 2004, titled "Transparent Elastomeric, Contact-Mode Photolithography Mask, Sensor, and Wavefront Engineering Element", describes a contact-mode photolithography phase mask which includes a diffracting surface having a plurality of indentations and protrusions. The protrusions are brought into contact with a surface of a positive photoresist, and the surface is exposed to electromagnetic radiation through the phase mask. The phase shift due to radiation passing through indentations as opposed to the protrusions is essentially complete. Minima in intensity of electromagnetic radiation are thereby produced at boundaries between the indentations and protrusions. The elastomeric mask conforms well to the surface of the photoresist, and following development of the photoresist, features smaller than 100 nm can be obtained. (Abstract) In one embodiment, reflective plates are used exterior to the substrate and the contact mask, so radiation will be bounced to a desired location at a shifted phase. In another embodiment, the substrate may be shaped in a manner which causes a deformation of the phase shifting mask, affecting the behavior of the phase shifting mask during exposure.

Near Field Surface Plasmon Lithography (NFSPL) makes use of near-field excitation to induce photochemical or photophysical changes to produce nanostructures. The main near-field technique is based on the local field enhancement around metal nanostructures when illuminated at the surface plasmon resonance frequency. Plasmon printing consists of the use of plasmon guided evanescent waves through metallic nanostructures to produce photochemical and photophysical changes in a layer below the metallic structure. In particular, visible exposure ($\lambda$=410 nm) of silver nanoparticles in close proximity to a thin film of a g-line photoresist (AZ-1813 available from AZ-Electronic Materials, Micro-Chemicals GmbH, Ulm, Germany) can produce selectively exposed areas with a diameter smaller than $\lambda$/20. W. Srituravanich et al. in an article entitled "Plasmonic Nanolithography", Nanoletters V4, N6 (2004), pp. 1085-1088, describes the use of near UV light (λ=230 nm-350 nm) to excite SPs on a metal substrate, to enhance the transmission through subwavelength periodic apertures with effectively shorter wavelengths compared to the excitation light wavelength. A plasmonic mask designed for lithography in the UV range is composed of an aluminum layer perforated with 2 dimensional periodic hole arrays and two surrounding dielectric layers, one on each side. Aluminum is chosen since it can excite the SPs in the UV range. Quartz is employed as the mask support substrate, with a poly(methyl methacrylate) spacer layer which acts as adhesive for the aluminum foil and as a dielectric between the aluminum and the quartz. Poly(methyl methacrylate is used in combination with quartz, because their transparency to UV light at the exposure wavelength (i-line at 365 nm) and comparable dielectric constants (2.18 and 2.30, quartz and PMMA, respectively). A sub-100 nm dot array pattern on a 170 nm period has been successfully generated using an exposure radiation of 365 nm wavelength. Apparently the total area of patterning was about 5 µm×5 µm, with no scalability issues discussed in the paper.

Joseph Martin has suggested a proximity masking device for Near-filed lithography in U.S. Pat. No. 5,928,815, where cylindrical block covered with metal film for light internal reflection is used for directing light to the one end of the cylinder (base of the cylinder), which contains a surface relief pattern used for Near-field exposure. This block is kept in some proximity distance ("very small, but not zero") from the photoresist on the sample. Cylinder is translated in horizontal direction using some precise mechanism, which is used to pattern photoresist area.

The only published idea about using rollers for optical lithography can be found in the Japanese Unexamined Patent Publication, No. 59200419A, published Nov. 13, 1984, titled "Large Area Exposure Apparatus". Toshio Aoki et al. described the use of a transparent cylindrical drum which can rotate and translate with an internal light source and a film of patterned photomask material attached on the outside of the cylindrical drum. A film of a transparent heat reflective material is present on the inside of the drum. A substrate with an aluminum film on its surface and a photoresist overlying the aluminum film is contacted with the patterned photomask on the drum surface and imaging light is passed through the photomask to image the photoresist on the surface of the aluminum film. The photoresist is subsequently developed, to provide a patterned photoresist. The patterned photoresist is then used as an etch mask for an aluminum film present on the substrate.

There is no description regarding the kinds of materials which were used as a photomask film or as a photoresist on the surface of the aluminum film. A high pressure mercury lamp light source (500 W) was used to image the photoresist overlying the aluminum film. Glass substrates about 210 mm (8.3 in.)×150 mm (5.9 in.) and about 0.2 mm (0.008 in.) thick were produced using the cylindrical drum pattern transfer apparatus. The feature size of the pattern transferred using the technique was about 500 µm, which was apparently a square having a dimension of about 22.2 µm×22.2 µm. This feature size was based on the approximate pixel size of an LCD display at the time the patent application was filed in 1984. The photomask film on the outside of the cylindrical drum was said to last for approximately 140,000 pattern transfers. The contact lithography scheme used by Toshio Aoki et al. is not capable of producing sub-micron features.

It does not appear that nanoimprinting methods (thermal or UV-cured) or soft lithography using printing with SAM materials are highly manufacturable processes. In general, the imprinting method creates deformation of the substrate material due to the thermal treatment (thermal NIL, for example) or shrinkage of pattern features upon polymer curing (UV-cured polymeric features). Moreover, due to the application of pressure (hard contact) between a stamp and a substrate, defects are essentially unavoidable, and a stamp has a very limited lifetime. Soft lithography does have an advantage in that it is thermal and stress-free printing technology. However, the use of a SAM as an "ink" for a sub-100 nm pattern is very problematic due to the drifting of molecules over the surface, and application over large areas has not been proved experimentally.

Earlier authors have suggested a method of nanopatterning large areas of rigid and flexible substrate materials based on near-field optical lithography described in Patent applications WO2009094009 and US20090297989, where a rotatable cylindrical or cone-shaped mask is used to image a radiation-sensitive material. The nanopatterning technique makes use of Near-Field photolithography, where the mask used to pattern the substrate is in contact with the substrate. The Near-Field photolithography may make use of an elastomeric phase-shifting mask, or may employ surface plasmon technology, where a rotating cylinder surface comprises metal nano holes or nanoparticles.

SUMMARY OF THE INVENTION

Embodiments of the invention pertain to methods and apparatus useful in the nanopatterning of large area substrates, rigid flat or curved objects or flexible films. The nanopatterning technique makes use of Near-Field UV photolithography, where the mask used to pattern the substrate is in contact with the substrate. The Near-Field photolithography may include a phase-shifting mask or surface plasmon technology. The Near-field mask is fabricated from a flexible film, which is nano structured in accordance with the desired pattern. In phase-shift method, one can use nanostructured elastomeric film, for example, Polydimethylsiloxane (PDMS) film. Nanostructuring can be done using laser treatment, selective etching or other available techniques, or it can be done by replication (molding, casting) from the nanostructured "masters", which are fabricated using known nanofabrication methods (like, e-beam writing, holographic lithography, direct laser writing or Nanoimprint step-and-repeat or roll-to-roll lithography). This film can be supported by another transparent flexible film (carrier). In plasmonic method one can use a film with metal layer having nanohole structure, created using one of the abovementioned methods or by depositing metal nanoparticles, for example, deposited from a colloid solution. In order to provide uniform contact area for near-field lithography we rely on Van-der-Vaals forces of stiction between elastomeric film and photoresist layer on the substrate. Alternatively, a transparent cylinder is used to provide controllable contact between nanostructured film and a substrate. Such cylinder may have flexible walls and can be pressurized by a gas to provide controllable pressure between a nanostructured film and a substrate.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

DESCRIPTION OF THE SPECIFIC EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within +−10%.

Embodiments of the invention relate to methods and apparatus useful in the nanopatterning of large area substrates, where a flexible nanostructured film is used to image a radiation-sensitive material. The nanopatterning technique makes use of near-field photolithography, where the wavelength of radiation used to image a radiation-sensitive layer on a substrate is 650 nm or less, and where the mask used to pattern the substrate is in contact with the substrate. The near-field photolithography may make use of a phase-shifting mask, or may employ surface plasmon technology, where a metal layer on movable flexible film's surface comprises nano holes, or metal nanoparticles are dispersed on the surface of such flexible film. The detailed description provided below is just a sampling of the possibilities which will be recognized by one skilled in the art upon reading the disclosure herein.

Figure 1A:
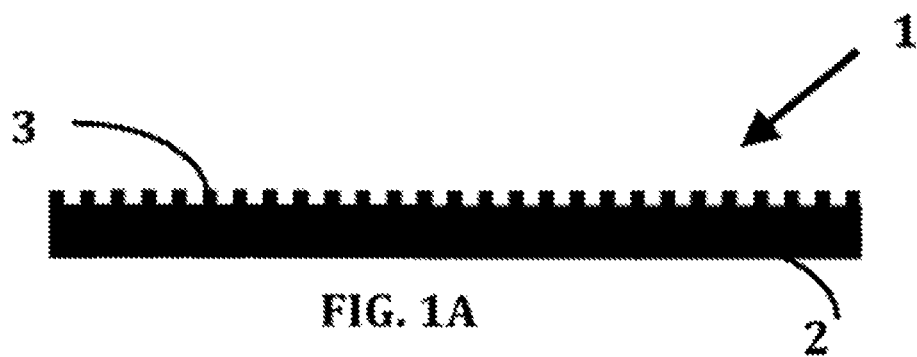
FIG. 1A shows a cross-sectional view of an embodiment of a flexible nanostructured film 1, having a phase-shift mask properties. Surface relief nanostructure 3 is fabricated on one of the surfaces of the film 2.

One of the embodiments suggests a phase-shift mask approach and is implemented by flexible nanostructured film. The problem of providing a uniform and permanent contact between such flexible nanostructured film and a substrate is solved by manufacturing this film from a material capable of creating strong but temporary bond to photoresist layer. One example of such material is an elastomer, for example Polydimethylsiloxane (PDMS). A PDMS film can be used to form a conformal, atomic scale contact with a flat, solid layer of photoresist. This contact is established spontaneously upon contact, without applied pressure. Schematic of such film is shown on FIG. 1A, where film 2 has a nanostructure 3 in the form of transparent surface relief.

Film 2 can be made from one material (for example, PDMS) or be a composite or multi-layer comprised of more than one material, for example, nanostructured PDMS can be laminated or deposited on a transparent and flexible support film. Such support film can be made of polycarbonate (PC), polymethylmethacrylate (PMMA), Polyethylene terephthalate (PET), amorphous fluoric-polymer, for example CYTOP, and other materials. Deposition of PDMS on transparent flexible support film can be done using one of available techniques, for example, dipping, spraying or casting. Support film can be treated using oxygen plasma, UV ozone, corona discharge or adhesion promoters, like silanes to promote better adhesion between elastomeric film and a polymer film support.

Another embodiment of "sticky" material, which can be used instead of elastomer, to create a dynamic contact with photoresist is cross-linked silane material. Such material can be deposited from a silane precursor (usually used to deposit self-assembled monolayers, SAMs) with abundance of water/moisture. For example, DDMS (dichlorodimethylsilane) creates very sticky surface if deposited with abundance of moisture. In this embodiment, the carrier layer is nanostructured using one of known nanostructuring techniques (preferably, Roll-to-Roll Nanoimprint lithography) and then coated with silane material to provide "stickyness".

A surface relief for phase-shift lithography can be created in the elastomeric or silane film using any of the following methods: First, nanostructured "master" can be obtained using one of the available nanofabrication techniques (deep-UV stepper, e-beam, ion-beam, holography, laser treatment, embossing, Nanoimprint, and others). Second, a replica of desired nanostructure can be obtained from such master on the surface of elastomeric film using, for example, casting or molding, in roll-to-roll or step-and-repeat mode.

Another embodiment suggests that the carrier layer may be nanostructured using a suitable nanostructuring technique (e.g., Roll-to-Roll Nanoimprint lithography with a UV-curable liquid resist) and then coated with elastomer material (like PDMS) or silane material (like DDMS) to provide "stickyness".

The nanostructure of such a mask can be designed to act as phase shifter, and in this case the height of the features should be proportional to $\pi$. For example, PDMS material having refractive index 1.43 for wavelength of exposure 365 nm should have features with depth about 400 nm to cause a phase shift effect. In this case a local minima of light intensity will happen at the step edges of the mask. For example, lines from 20 nm to 150 nm can be obtained in photoresist corresponding to the positions of surface relief edges in the phase-shift mask. Thus this lithography has image reduction properties, and nanostructures can be achieved using much larger features on the mask.

Another embodiment is using nanostructure on flexible mask to act as 1:1 replication mask. As it was demonstrated in previous publications, for example, Tae-Woo Lee, at al in Advanced Functional Materials, 2005, 15, 1435, depending on specific parameters of photoresist exposure and development, one can achieve 1:1 replication of the features from mask to photoresist or feature size reduction using phase-shift on the surface relief edges on the same elastomeric mask. Specifically, underexposure or underdevelopment against the normal exposure doze and development time, would cause a significant differential between an effective exposure doze in non-contact and contact regions of the mask. This can be used to create a 1:1 replication from mask to photoresist in positive or negative tone (depending on photoresist type). Alternatively, the flexible mask 1 may be used with a UV-curable liquid resist 7 to pattern the substrate 6, e.g., in Rolling Mask imprint lithography.

Figure 1B:
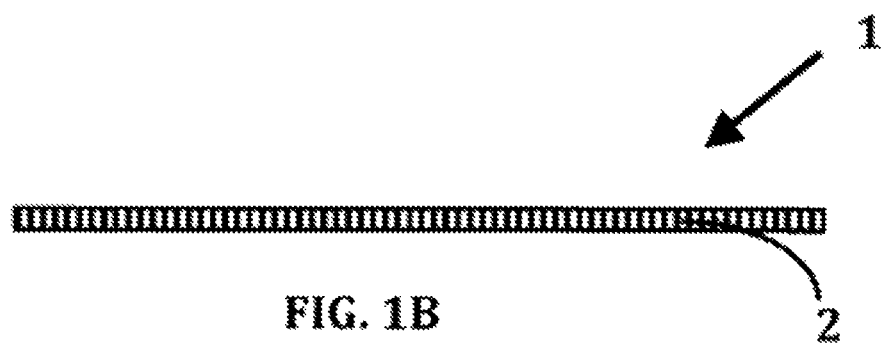
FIG. 1B shows a cross-sectional view of an embodiment of a flexible nanostructured film 1, having a plasmonic mask properties. An array of nanoholes is created in the film or array of nanoparticles are deposited on its surface.

Another embodiment suggests a plasmonic mask approach. Such plasmonic film could be a flexible metal film, shown on FIG. 1B, which has arrays of nanoholes according to the desired pattern. Alternatively, metal layer is deposited on flexible transparent film. Metal layer patterning can be done using one of available nanopatterning techniques (deep-UV stepper, e-beam, ion-beam, holography, laser treatment, embossing, Nanoimprint, and others), followed by metal layer etching.

Alternatively, a nanopattern can be fabricated using abovementioned methods on a transparent film, and then metal material can be deposited over nanopatterned resist, followed by metal layer lift-off.

And yet another embodiment uses metal nanoparticles dispensed in controllable way over the surface of the flexible transparent film to create a plasmonic mask. For example, metal nanoparticles can be mixed with PDMS material in a liquid phase prior to depositing it onto the flexible transparent support film. Alternatively, metal nanoparticles can be deposited onto nanotemplate fabricated in elastomeric layer.

Figure 2:
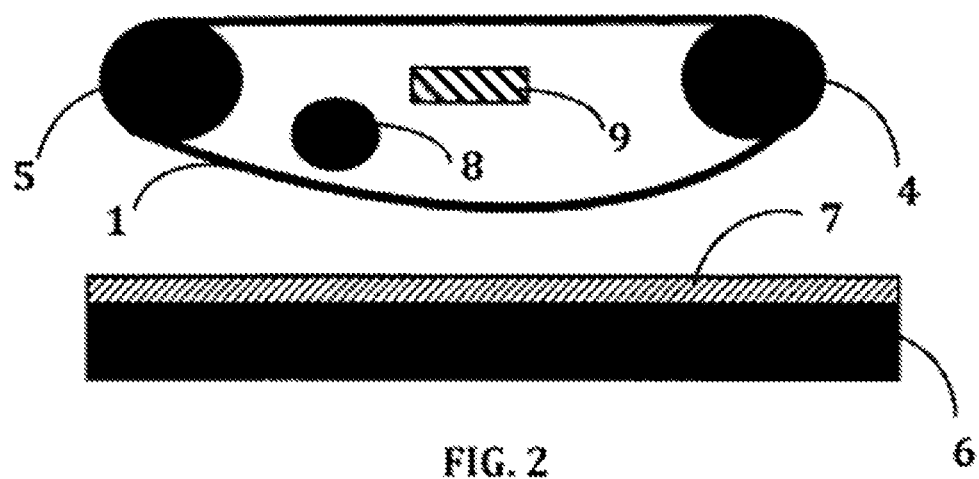
FIG. 2 shows a suggested nanopatterning system prior to starting the process. A nanostructured film 1 is wrapped around support drums 4 and 5. Substrate 6 has a photoresist layer 7 deposited on its surface.

A nanostructured film can be wrapped around support drums 4 and 5, and kept at a controllable tension, as shown on FIG. 2.

Figure 3:
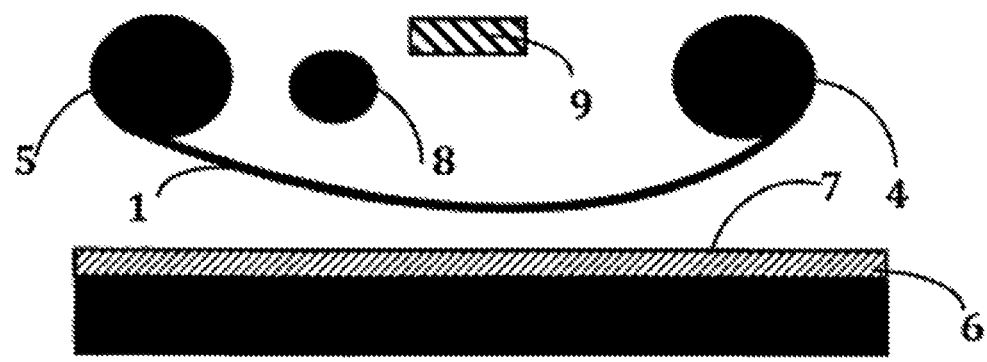
FIG. 3 shows another embodiment where nanostructured film 1 can be rolled from one roll 4 to another roll 5.

Alternatively, a nanostructured films can be rolled from one roll 4 to another roll 5, as shown on FIG. 3.

Figure 4:
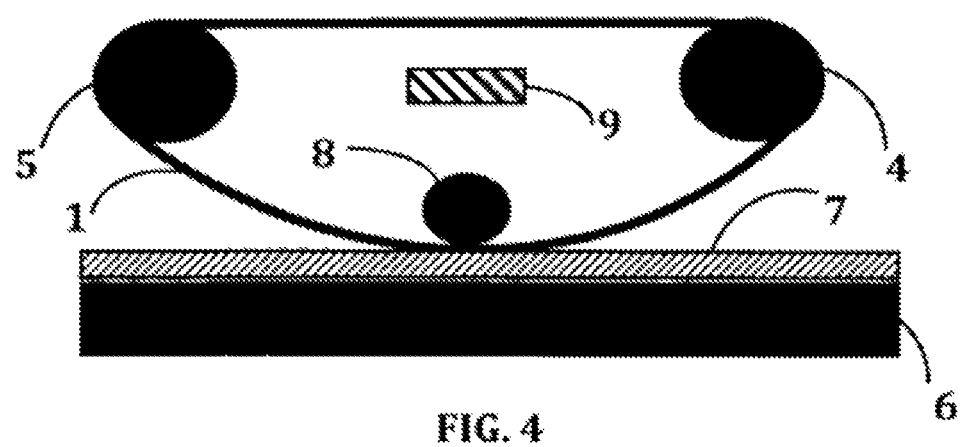
FIG. 4 shows a starting point of the process, when a film 1 is brought to contact with a photoresist 7 using movable arm 8.
Figure 5:
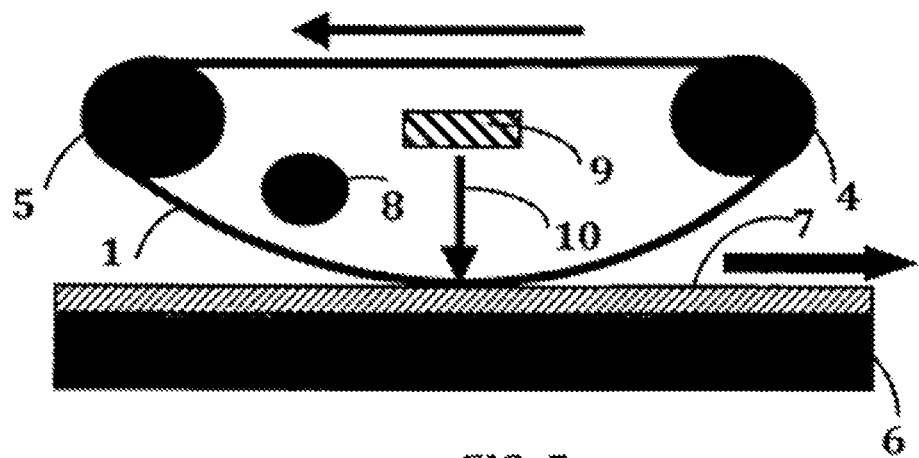
FIG. 5 shows the patterning process, when the arm 8 is removed from the film-substrate contact, substrate 6 is translating in one direction, and UV light source 7 is illuminating the contact zone between a film and a substrate.

The process starts by bringing a nanostructured film 1 in contact with the photoresist 7 deposited on the substrate 6, using a movable arm 8, as shown on FIG. 4. Such contact will engage Van-der-Vaals forces and make film temporary stick to the photoresist. Then, as it is shown on FIG. 5, movable arm 8 is removed from the film-substrate contact, light source, which may include optical focusing, collimating or filtering system, 9 is turned on, providing exposure to the area of film-substrate contact, and substrate 6 is translated in one direction using constant or variable speed. Such translation will make film to move as well in the direction of the translation, exposing different parts of the substrate to the same or different pattern, depending on the nanostructure fabricated on the film.

Figure 6:
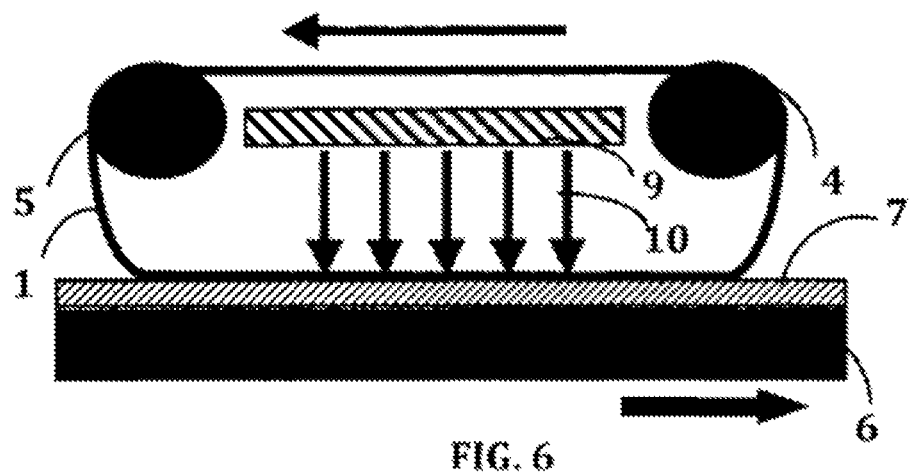
FIG. 6 shows another embodiment, where a nanopatterned film is in contact with the substrate in a quite wide surface area.

Another embodiment, presented in FIG. 6, shows nanostructured film in contact with the photoresist across a wider area. This area of contact starts to move as soon as substrate begins translation in one direction. The width of contact area between a nanostructured film and a substrate can be changed by changing a relative position between the substrate 6 and drums 4 and 5, and also by changing tackiness of the nanostructured film material. This configuration also allows an increase in the area of the nanostructured film that is exposed to light, which helps to improve a throughput of the method due to increase in dynamic exposure dosage.

Figure 7:
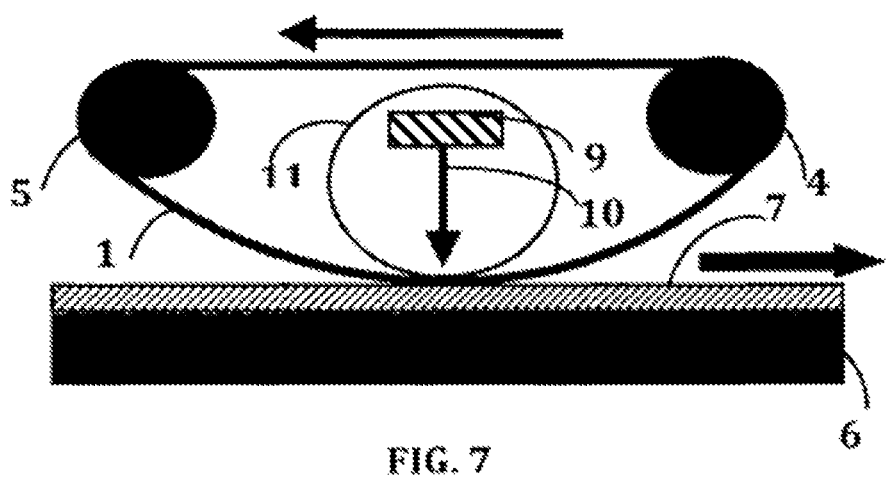
FIG. 7 shows an embodiment, where the transparent cylinder 11 is used to bring nanostructured film 1 in contact with photoresist 7 on the substrate 6.

When nanostructured film surface contact is not tacky enough (like, for example, in case of plasmonic mask approach) the movable arm is not retracted, keeping controllable and uniform pressure between the nanostructured film and a substrate. For example, the movable arm can be fabricated in the form of transparent cylinder 11, as shown on FIG. 7. This cylinder is actuated by the mechanical system providing controllable and uniform contact between nanostructured film and a substrate. In that case, source of illumination 9 could be located inside such a cylinder.

Such cylinder can be made from transparent flexible material and pressurized by a gas. In such case the area of contact and pressure between a mask and a substrate can be controlled by gas pressure.

The gas can be flown through flexible-wall cylinder constantly such as to create necessary controllable pressure and at the same time cool down the light source positioned inside this cylinder.

Figure 8:
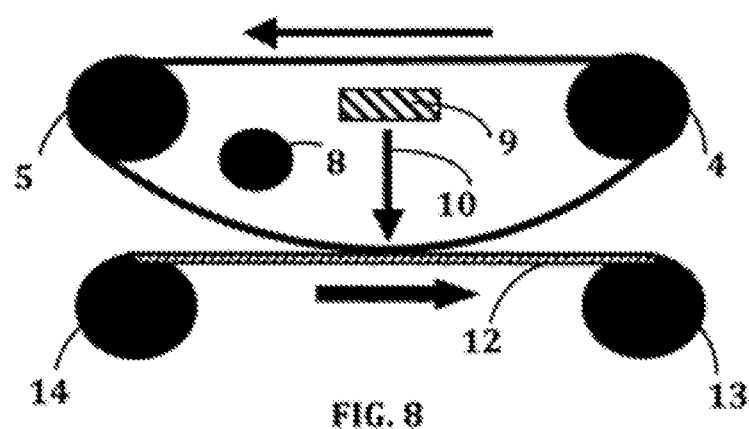
FIG. 8 shows an embodiment, where the substrate is a flexible film 12, which can be translated from one roll 14 to another 13.

Disclosed nanopatterning methods can be used to pattern flexible films 12, as shown on FIG. 8, which can be translated from one roll 14 to another roll 13 during exposure.

Figure 9:
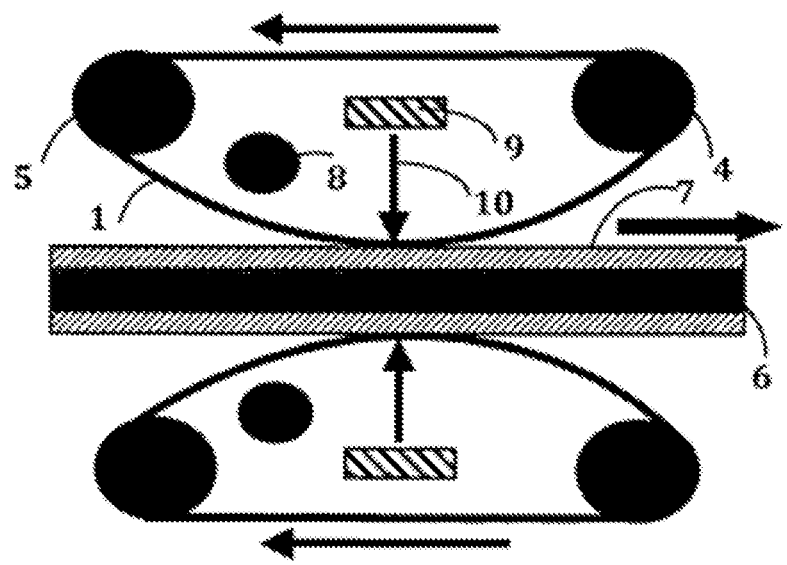
FIG. 9 shows the embodiment, where the substrate is nanopatterned from the both sides.

Disclosed nanopatterning methods can be used to pattern rigid or flexible materials from the both sides, as shown on FIG. 9.

Figure 10A:
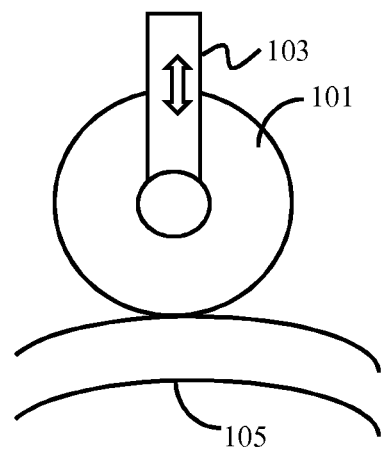
FIG. 10a and FIG. 10b illustrate alternative embodiments involving patterning of non-flat or curved substrates.
Figure 10B:
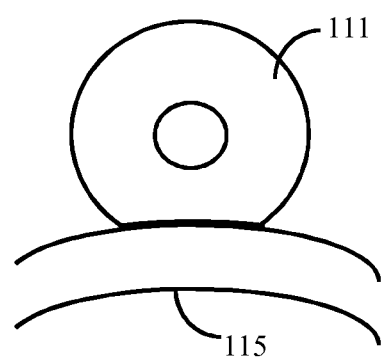

Disclosed nanopatterning methods can be used to pattern non-flat or curved substrates, as shown on FIG. 10. FIG. 10a shows how cylinder 101 on a movable arm 103 is following the curvature of the substrate 105, and FIG. 10b shows how flexible-wall gas pressurized cylinder 111 is following the curvature of the substrate 115. In the latter case, instead of moving the arm in the vertical direction, one can adjust pressure inside cylinder 111 to accommodate substrate height deviation caused by curvature.

What is claimed is:

1. A method of nanopatterning comprising:
    a) providing a substrate having a radiation-sensitive layer on said substrate surface;
    b) providing a movable nanostructured film, having a surface relief, wherein said nanostructured film is a phase mask which causes radiation to form an interference pattern in said radiation-sensitive layer;
    c) contacting said nanostructured film with said radiation-sensitive layer on said substrate along a surface of contact, wherein the nanostructured film hangs from a first and second drum and is sufficiently tacky that contact with the radiation-sensitive layer is made over a distance between the first and second drums without applied pressure;
    d) distributing radiation through said contact such that the radiation source provides radiation along the distance between the drums, while translating said substrate against said film.

2. A method in accordance with claim 1, wherein said nanostructured film causes modulation of light intensity in the plane of said radiation-sensitive layer.

3. A method in accordance with claim 2, wherein said nanostructured film is made of conformable elastomeric material.

4. A method in accordance with claim 2, wherein said nanostructured film is made of a more than one layer of transparent flexible materials.

5. A method in accordance with claim 4, wherein the outer layer is made of elastomeric material.

6. A method in accordance with claim 4, wherein the outer layer is made of silane material.

7. A method in accordance with claim 1, wherein said surface relief is fabricated by molding or casting from nano structured master substrate.

8. A method in accordance with claim 1, wherein a movable arm is present, but not applying pressure between the radiation sensitive layer and the nanostructured film during exposure of the radiation sensitive layer to the distributing radiation.

9. A method in accordance with claim 8, wherein said movable arm is a cylinder.

10. A method in accordance with claim 9, wherein said cylinder has flexible walls and is pressurized by a gas.

11. A method in accordance with claim 9, wherein a light source is positioned inside such cylinder.

12. A method in accordance with claim 1, wherein said substrate is translated in a direction toward or away from a contact line of said nanostructured film during distribution of radiation from said contact line.

13. A method in accordance with claim 1, wherein said nanostructured film is moved in a closed loop.

14. A method in accordance with claim 1, wherein said nanostructured film is translated between the first and second drums.

15. A method in accordance with claim 1, wherein said substrate is rigid plate.

16. A method in accordance with claim 1, wherein said substrate is has a curvature.

17. A method in accordance with claim 1, wherein said substrate is a flexible film.

18. A method in accordance with claim 1, wherein an additional nanostructured flexible film and a light source are provided on the other side of the substrate coated with photo-sensitive layer on both surfaces for nanopatterning on both sides of the substrate.

19. A method in accordance with claim 1, wherein said radiation-sensitive layer is a UV-curable liquid resist.

20. An apparatus to carry out nanopatterning, comprising:
  a) a nanostructured film that hangs from a first and second drum and is sufficiently tacky that contact with a radiation-sensitive layer can be made over a distance between the drums without applied pressure, wherein said nanostructured film is a phase mask which causes radiation to form an interference pattern in said radiation-sensitive layer, and;
  b) a radiation source which supplies radiation of a wavelength of 650 nm or less through a portion of said nanostructured film along the distance between the first and second drums, while said portion is in contact with a radiation-sensitive layer of material.

21. An apparatus in accordance with claim 20, wherein nanostructured film is a polymer having surface relief.

22. An apparatus in accordance with claim 20, wherein said nanostructured film has more than one layer.

23. An apparatus in accordance with claim 20, wherein a movable cylinder is provided to control nanostructured film contact with said radiation-sensitive layer.

24. An apparatus in accordance with claim 23, wherein such cylinder is pressurized by a gas.

25. An apparatus in accordance with claim 20, wherein said nanostructured film is configured to translate between the first and second drums.

26. An apparatus in accordance with claim 20, wherein said nanostructured film is configured to move in a closed loop.

* * * * *